US006556450B1

(12) United States Patent
Rasmussen et al.

(10) Patent No.: US 6,556,450 B1
(45) Date of Patent: Apr. 29, 2003

(54) METHODS AND APPARATUS OF DOCKING A GAMING CONTROL BOARD TO AN INTERFACE BOARD IN A GAMING MACHINE

(75) Inventors: James M. Rasmussen, Chicago, IL (US); Gregory J. Tastad, Kenosha, WI (US); Norman R. Wurz, Des Plaines, IL (US); Derek S. Curran, St. Paul, MN (US)

(73) Assignee: WMS Gaming Inc., Waukegan, IL (US)

( * ) Notice: Subject to any disclaimer, the term of this patent is extended or adjusted under 35 U.S.C. 154(b) by 0 days.

(21) Appl. No.: 10/117,474

(22) Filed: Apr. 8, 2002

(51) Int. Cl.[7] ............................ H05K 7/10; H05K 7/12; H01R 13/00

(52) U.S. Cl. ....................... 361/754; 361/801; 439/151; 439/152

(58) Field of Search ................................ 361/724–727, 361/752, 754, 797, 798, 802, 807, 796, 801, 753; 439/151–160

(56) References Cited

U.S. PATENT DOCUMENTS

| | | | | | |
|---|---|---|---|---|---|
| 5,377,807 | A | * | 1/1995 | Kojima et al. | 194/215 |
| 5,662,204 | A | * | 9/1997 | Menke et al. | 194/215 |
| 6,042,115 | A | * | 3/2000 | Ward | 273/143 |
| 6,112,876 | A | * | 9/2000 | Juds et al. | 194/344 |
| 6,201,703 | B1 | * | 3/2001 | Yamada et al. | 361/752 |
| 6,266,253 | B1 | | 7/2001 | Kurrer et al. | 361/796 |
| 6,269,007 | B1 | | 7/2001 | Pongracz et al. | 361/759 |
| 6,272,005 | B1 | | 8/2001 | Jensen et al. | 361/680 |
| 6,285,563 | B1 | | 9/2001 | Nelson et al. | 361/784 |
| 6,364,769 | B1 | * | 4/2002 | Weiss et al. | 463/29 |
| 6,379,245 | B2 | * | 4/2002 | De Keller | 463/13 |
| 6,406,312 | B1 | * | 6/2002 | Heitkamp | 439/160 |
| 6,475,087 | B1 | * | 11/2002 | Cole | 463/20 |
| 6,477,251 | B1 | * | 11/2002 | Szrek et al. | 380/46 |
| 6,485,367 | B1 | * | 11/2002 | Joshi | 463/13 |
| 2002/0025844 | A1 | * | 2/2002 | Casey et al. | 463/16 |

* cited by examiner

*Primary Examiner*—David Martin
*Assistant Examiner*—Dameon E. Levi

(57) ABSTRACT

A docking mechanism for releasably interconnecting an electronics subassembly and a game interface board in a gaming machine. The electronics subassembly includes a housing enclosing a gaming control board. The docking mechanism includes an operating lever which is moveable between a docked position and an undocked position. Two latches are rotatably mounted to the operating lever and engage or disengage the electronics subassembly from the game interface board when the operating lever is moved from the docked or undocked positions, respectively. An optional housing door may be locked to prevent unauthorized access to the gaming control board.

50 Claims, 8 Drawing Sheets

METHODS AND APPARATUS OF DOCKING A GAMING CONTROL BOARD TO AN INTERFACE BOARD IN A GAMING MACHINE

FIELD OF THE INVENTION

The present invention relates generally to gaming machines, and, more particularly, to a docking mechanism to facilitate installation and removal of electronic gaming machine components.

BACKGROUND OF THE INVENTION

Gaming machines, such as slot machines, video poker machines, and the like, have been a cornerstone of the gaming industry for several years. They have also been the target of unscrupulous individuals who seek to tamper with the normal operation of the machine in order to increase the chances of a payout. The electronic circuitry that controls the operation of the gaming machine is particularly vulnerable to tampering. Accordingly, there is a continuing need for increased security to protect the electronic circuitry against tampering. In addition, some of the machine's circuitry may need to be repaired or upgraded as components wear out or become obsolete or new or additional enhancements are desired. Profitability to the operator is adversely affected the longer a gaming machine is taken out of service for repair or upgrade.

A typical gaming machine includes several circuit boards for controlling the operation of the machine. Access to or removal of these circuit boards is time consuming, requiring the operator to be properly grounded to prevent electrostatic discharge and to use tools to remove the circuit boards. Moreover, servicing the machine in full view of the patrons is not desirable, so the entire machine may be removed from the gaming environment while repairs or upgrades are performed at a more discrete location. In the meantime, players are deprived of a game and operators lose money while the machine is out of service. If multiple machines need to be repaired or upgraded, these deleterious effects are multiplied.

In addition, while the circuit boards of a gaming machine typically reside inside a locked area within the gaming machine, they are afforded only limited additional protection against tampering by, for example, a wayward operator. Opportunistic patrons may also employ electronic devices to generate disruptive electromagnetic fields to cause a gaming machine to deviate from its programmed payout algorithm. What is needed, therefore, is a docking system that allows a circuit board of a gaming machine to be removed and installed quickly and easily by an operator without having to perform repairs or upgrades onsite, without having to remove the entire machine to another location, and without compromising protection from electrostatic discharge. The present invention is directed to satisfying this and other needs. Further, these gaming machines would benefit from a system that secures the circuitry of the gaming machine against tampering. The present invention also provides this benefit.

SUMMARY OF THE INVENTION

A docking assembly for use in a gaming machine includes an interface board secured to a mounting plate in the gaming machine, an electronics subassembly, and a docking mechanism for releasably interconnecting the electronics subassembly to the interface board. The electronics subassembly includes a housing and a gaming control board disposed within the housing. The gaming control board includes both logic circuitry and high-power circuitry. The logic circuitry includes a CPU for executing instructions for randomly selecting a plurality of game outcomes. The high-power circuitry interfaces the gaming control board with high-power devices of the gaming machine, such as lamps visible to a player, a hopper, a currency validator, and a power supply.

According to a specific aspect of the present invention, the docking mechanism includes an operating lever which is moveable between a docked position and an undocked position, and a first latch and a second latch rotatably mounted on the operating lever. When the operating lever is moved to the docked position, the first and second latches urge the electronics subassembly toward the interface board. Conversely, when the operating lever is moved to the undocked position, the first and second latches urge the electronics subassembly away from the interface board.

The above summary of the present invention is not intended to represent each embodiment, or every aspect, of the present invention. This is the purpose of the figures and the detailed description which follow.

BRIEF DESCRIPTION OF THE DRAWINGS

The foregoing and other advantages of the invention will become apparent upon reading the following detailed description and upon reference to the drawings.

Figure 1:
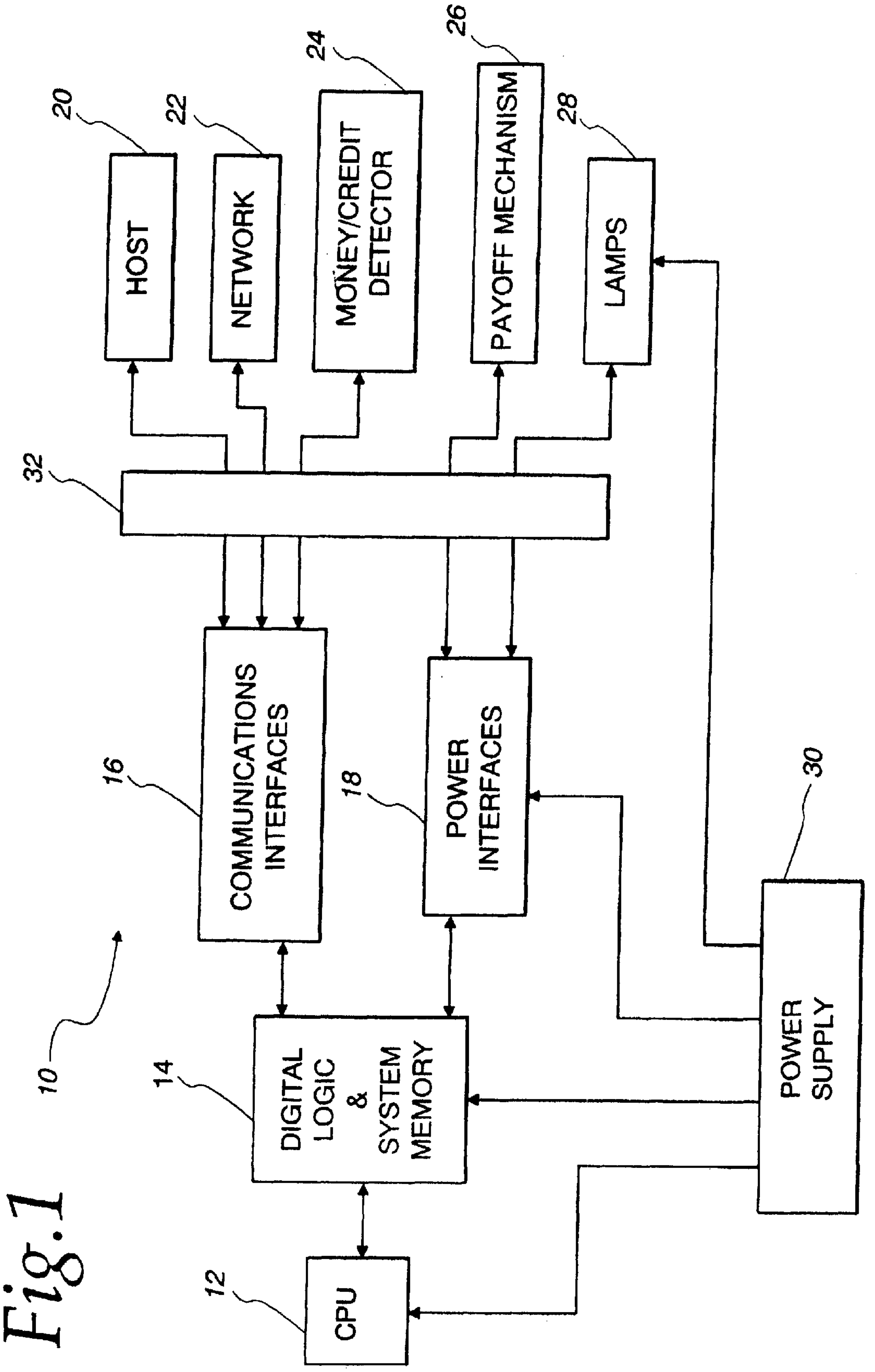
FIG. 1 is a functional block diagram of a typical gaming machine.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

FIG. 1 illustrates a block diagram of selected electronic circuitry and devices of a typical gaming machine 10. The electronic circuitry of the gaming machine 10 generally includes a central processing unit (CPU) 12, digital logic and system memory circuitry 14, communications interface components 16, and power interface components 18. The communications interface components 16 are coupled to peripheral devices such as a host 20, a network 22, and a money/credit detector 24 (such as a currency validator). The power interface components 18 are coupled to peripheral devices such as a payoff mechanism 26 and lamps 28. A power supply 30 supplies power to the electronic components of the gaming machine 10. The payoff mechanism 26 may be a coin/token hopper, a coupon/ticket/bill dispenser, or a media reader, for example. As is known, the gaming machine 10 includes numerous other devices which are not shown in FIG. 1, such as any combination of game push-buttons, coin optos, sensors, a video display, a touchscreen, a reel, a printer, and audio devices, for example.

A backplane 32 interfaces the devices of the gaming machine including the host 20, the network 22, the money/credit detector 24, the payoff mechanism 26, and the lamps 28 with the communications interface components 16 and the power interface components 18. The devices are connected to the backplane 32 via one or more wiring harnesses, and the backplane 32 is connected to the communications interface components 16 and the power interface components 18 via one or more connectors.

Figure 2:
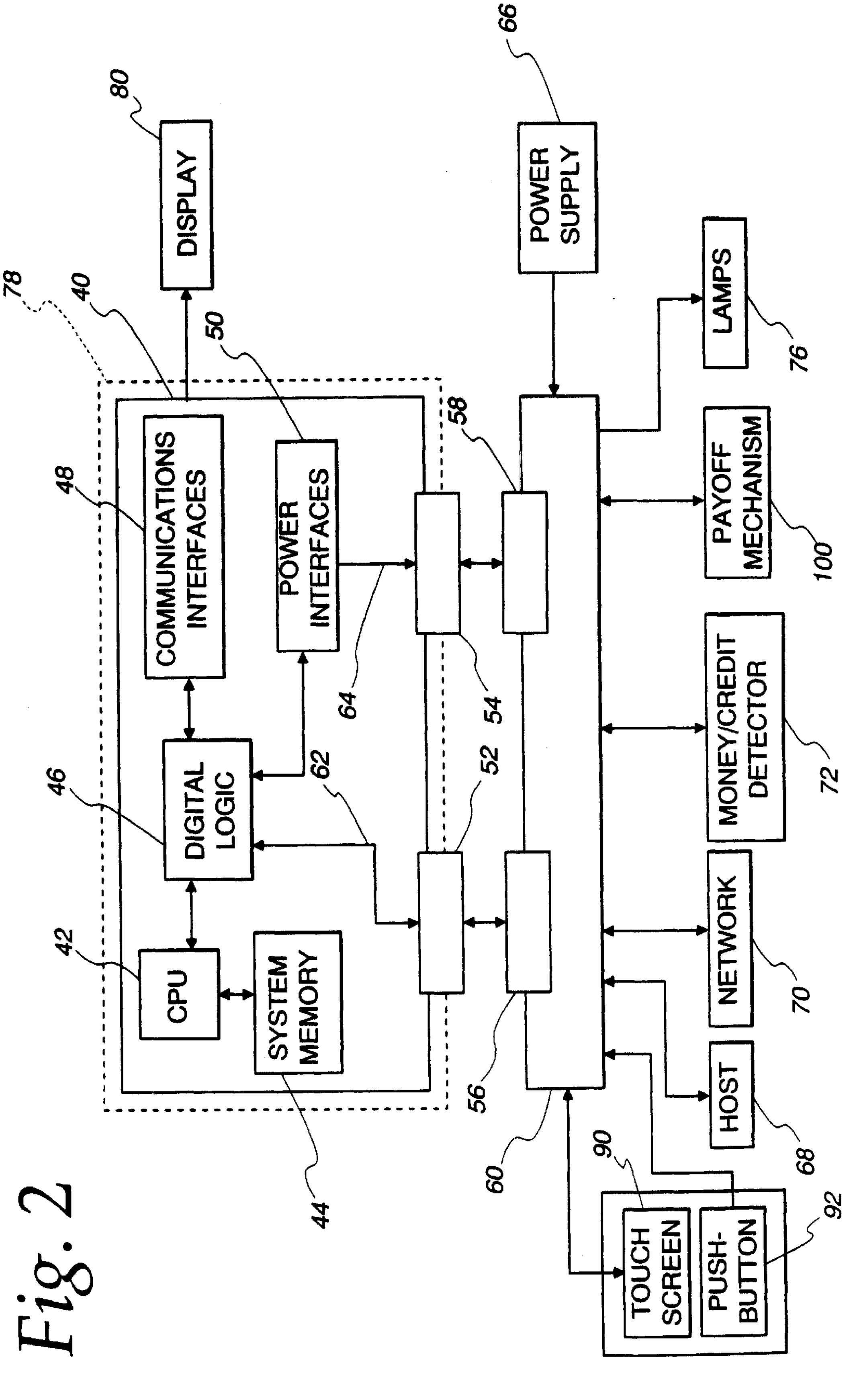
FIG. 2 is a functional block diagram of a gaming control board and a game interface board assembly according to the present invention.

FIG. 2 shows the electronic circuitry disposed on a single gaming control board 40 according to the present invention. The gaming control board includes low-power components and high-power components. The low-power components include a CPU 42, a system memory 44, digital logic components 46, and communications interface components 48. The high-power components include power interface components 50.

A first connector 52 and a second connector 54 are disposed on the gaming control board 40. The first connector 52 is adapted to mate with a first game interface board connector 56 on a game interface board 60. The second connector 54 is adapted to mate with a second game interface board connector 58 on the game interface board 60. The first connector 52 and the first game interface board connector 56 are complements of each other. For example, the first connector 52 may be a male-type connector and the first game interface board connector 56 may be a female-type connector, or vice versa. Likewise, the second connector 54 and the second game interface board connector 58 are complements of each other. For example, the second connector 54 may be a female-type connector and the second game interface board connector 58 may be a male-type connector, or vice versa.

The first connector 52 is coupled to the digital logic components 46 which carry low-power signals on line 62 to the first game interface board connector 56 when the first connector 52 and the first game interface board connector 56 are connected together. The low-power signals on line 62 include low-power I/O signals such as digital or TTL-level signals or low-power analog signals. The second connector 54 is coupled to the power interface components 50 which carry high-power signals on line 64 to the second game interface board connector 58 when the second connector 54 and the second game interface board connector 58 are connected together. The high-power signals on line 64 include power-supply signals from a power supply 66 and driver signals which carry electrical power to high-power devices of the gaming machine 10 such as lamps.

The first game interface board connector 56 and the second game interface board connector 58 are disposed on the game interface board 60 to engage and mate with the first connector 52 and second connector 54 of the gaming control board 40 when the gaming control board 40 and the game interface board 60 are connected together. In one embodiment, the connectors 52, 54, 56, 58 are zero-insertion force (ZIF) connectors, and may be locked together with a locking actuator, for example. In another embodiment, a force must be applied to mate connectors 52, 54 to connectors 56, 58, respectively.

In a specific embodiment, the first connector 52 and the first game interface board connector 56 are of a 160-pin, D-sub type, and the second connector 54 and the second game interface board connector 58 are of a 37-pin, D-sub type. As noted above, the low-power I/O signals on line 62 are coupled to the game interface board 60 through the first connector 52 and the first game interface board connector 56. Because of the low-current carrying capacity of these signals, the pins on the connectors 52, 56 may be close together, with relatively little electrical isolation between pins. As a result, the connectors 52, 56 may include substantially more pins than the connectors 54, 58. The high-power signals on line 64 demand greater electrical isolation to prevent electromagnetic coupling between adjacent signals, and therefore, the connectors 54, 58 are not as densely packed with pins as the connectors 52, 56. In a specific embodiment, the ratio of the number of pins on the connectors 52, 56 to the number of pins on the connectors 54, 58 is at least three-to-one, and the spacing between pins of the connectors 54, 58 is about 0.120 inches, and the spacing between pins of the connectors 52, 56 is about 0.040 inches.

The gaming control board 40 may also include one or more other connectors, such as, for example, a serial port connector, a parallel port connector, a USB connector, a video display connector, or a CompactFlash card connector.

Still referring to FIG. 2, the game interface board 60 is connected to peripheral devices of the gaming machine 10 such as, for example, a host 68, a network 70, a money/credit detector 72, a payoff mechanism 100, and lamps 76. As noted above, the gaming machine 10 may include other devices besides those shown in FIG. 2. The payoff mechanism 100 may be a coin/token hopper, a coupon/ticket/bill dispenser, and a media reader, for example.

In one embodiment, the system memory 44 includes a separate read-only memory (ROM) and battery-backed or nonvolatile random-access memory (RAM). However, it will be appreciated that the system memory 44 may be implemented on any of several alternate types of memory structures or may be implemented on a single memory structure.

The digital logic components 46 may include any combination of the following: a video controller, a host controller, a digital signal processor (DSP), an application-specific integrated circuit (ASIC), a field-programmable gate array (FPGA), or any other suitable transistor-transistor logic (TTL) components. The CPU 42 and memory 44 are also digital logic components.

The communications interface components 48 may include a Universal Asynchronous Receiver-Transmitter (UART) integrated circuit and/or a Universal Serial Bus (USB) controller for providing a communications interface with other devices or systems.

The power interface components 50 may include driver circuitry, such as lamp driver circuitry for driving the lamps of the gaming machine 10, motor driver circuitry for driving various motors in the gaming machine 10, and power supply components for converting voltages from the power supply 30 to appropriate levels. These power interface components 50 are preferably disposed proximate the second connector 54 to reduce the effects of undesired electromagnetic coupling generated by the high current levels. The coplanar arrangement of the gaming control board 40 and the game interface board 60 also advantageously reduces the effects of noise that might be coupled from the high-current carrying traces and components.

The gaming control board 40 is mounted on standoffs and enclosed in a housing 78. The housing 78 protects the gaming control board 40 from the effects of electromagnetic interference (EMI) and is made of an EMI-shielded material, such as metal or metal particle-coated plastic.

In one embodiment, the gaming machine 10 operates as follows. The money/credit detector 72 signals the CPU 42 when a player has inserted money or played a number of credits. The money may be provided by coins, bills, tickets, coupons, cards, etc. Then, the CPU 42 operates to execute a game program that causes the display 80 to display simulated symbol-bearing reels. The player may select a number of pay lines to play, an amount to wager, and start game play via a touch screen 90 or push-buttons 92, causing the CPU 42 to set the reels in motion, randomly select a game outcome or a plurality of game outcomes, and then stop the reels to display symbols corresponding to the pre-selected game outcome. In one embodiment, one of the basic game outcomes triggers a bonus feature.

The system memory 44 stores control software, operational instructions and data associated with the gaming machine 10. A payoff mechanism 100 is operable in response to instructions from the CPU 42 to award a payoff to the player in response to certain winning outcomes that might occur in the basic game or the bonus feature. The payoff may be provided in the form of coins, bills, tickets, coupons, cards, etc. The payoff amounts are determined by one or more pay tables stored in the system memory 44.

Figure 3:
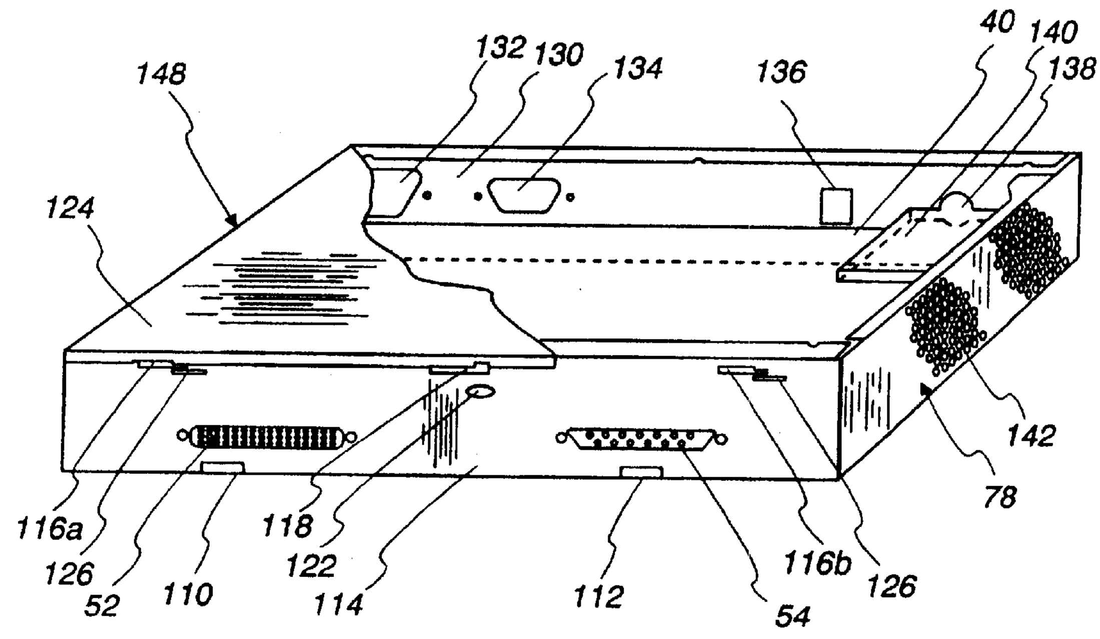
FIG. 3 is an isometric view of a housing partially exposing a gaming control board.

FIG. 3 illustrates an isometric, cut-away view of the housing 78 enclosing the gaming control board 40 in accordance with one embodiment of the present invention. The housing 78 includes a first latch engaging slot 10 and a second latch engaging slot 112 along a front panel 114 of the housing 78. The housing 78 further includes a door 124, which is preferably made of the same material (such as metal, for example) as the housing 78. The front panel 114 of the housing 78 also includes a first door hook aperture 116*a* and second door hook aperture 116*b*, a switch engaging aperture 118, a switch aperture 122, and mounting guide slots 126. The front panel 114 also includes apertures dimensioned to accept therethrough the first connector 52 and the second connector 54 of the gaming control board 40.

The housing 78 includes a rear interchangeable panel 130 which includes connector slots dimensioned to receive respective interface connectors on the gaming control board 40. In the embodiment illustrated in FIG. 3, the rear interchangeable panel 130 includes a 15-pin D-sub connector slot 132, a 9-pin D-sub connector slot 134, a USB connector slot 136, and a CompactFlash card slot 138. A CompactFlash card housing 140 accepts a CompactFlash card inserted through the CompactFlash card slot 138. The CompactFlash card includes software such as, for example, game code, game graphics, sound operating system code, sound data, and so forth. It is understood that fewer, additional, or other connector slots may be formed in the rear interchangeable panel 130.

The rear interchangeable panel 130 is removable to facilitate insertion and removal of the gaming control board 40 for repairs, upgrades, and the like. In this embodiment, the rear interchangeable panel 130 may be replaced with another rear interchangeable panel having a different configuration of connector slots in order to accommodate a gaming control board having a different arrangement of interface connectors. In another embodiment, the rear interchangeable panel 130 is not removable. In still another embodiment, one or more panels of the housing 78 may include a pattern of air holes 142 to facilitate the circulation of air across the gaming control board 40.

Figure 4:
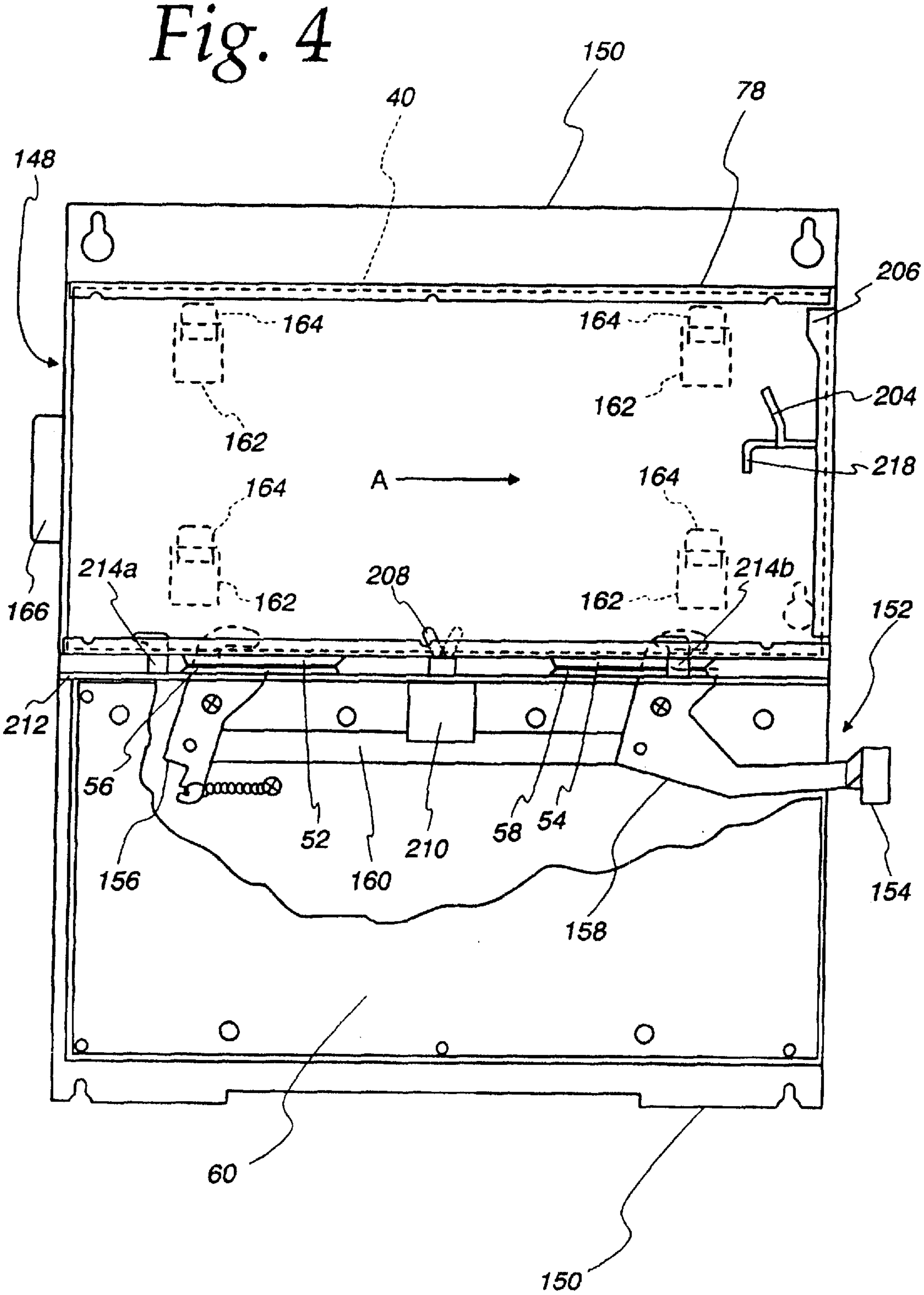
FIG. 4 illustrates a docking mechanism according to one aspect of the present invention releasably interconnecting a gaming control board assembly and a partially removed game interface board.

FIG. 4 illustrates a gaming control board assembly 148, which comprises the housing 78 and the gaming control board 40, in a pre-attachment position with respect to the game interface board 60 according to one aspect of the present invention. The game interface board 60 (a portion of which has been partially removed to expose the docking mechanism 152) is mounted to a mounting plate 150 which is secured to the interior of the gaming machine 10 or may form an interior wall of the gaming machine 10. A docking mechanism 152 includes an operating lever 154 pivotally mounted to the mounting plate 150, a first latching member 156 rotatably secured to the operating lever 154, and a second latching member 158 rotatably secured to the operating lever 154. A connecting member 160 is coupled between the first latching member 156 and second latching member 158.

Figure 6:
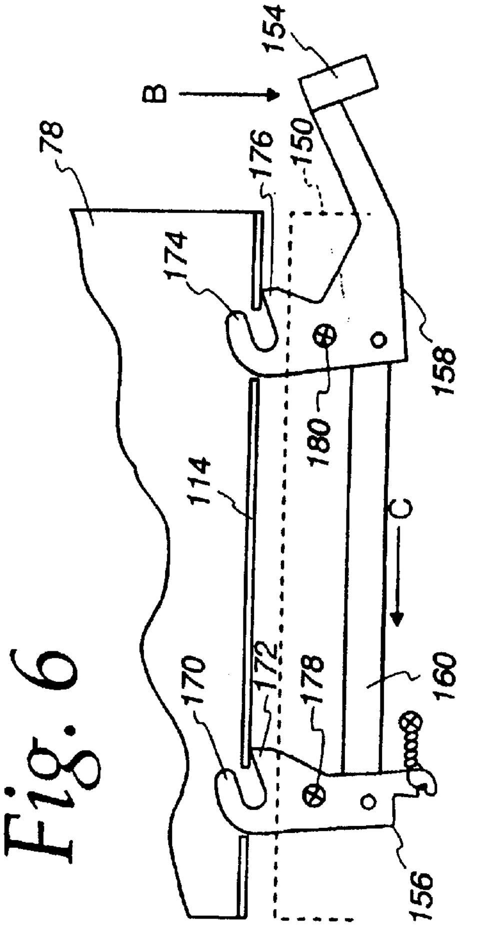
FIG. 6 illustrates a docking mechanism in an undocked position.
Figure 7:
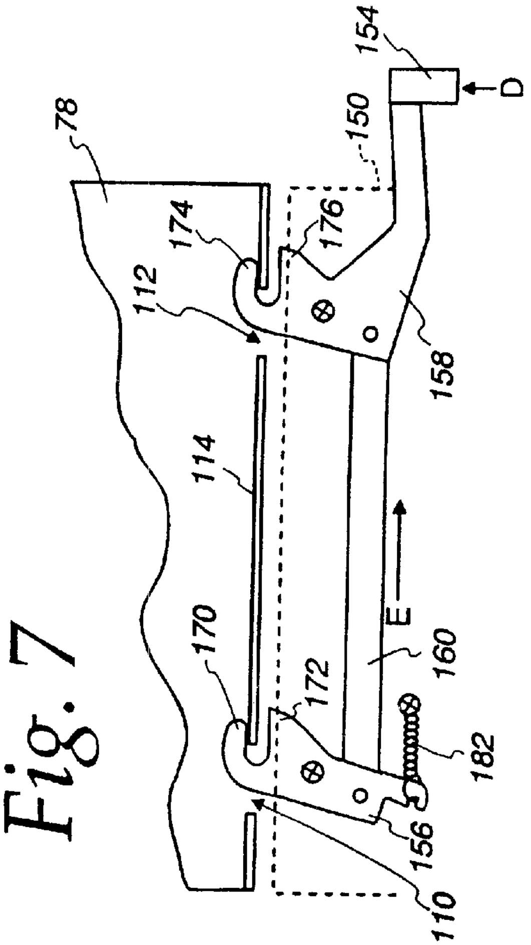
FIG. 7 illustrates a docking mechanism in a docked position.

The operating lever 154 shown in FIGS. 4, 6, and 7 is dimensioned to extend beyond the mounting plate 150. In another embodiment, the operating lever 154 may be dimensioned to extend no further than the edge of the mounting plate 150.

The housing 78 includes at least one locating guide 162 disposed on the panel facing the mounting plate 150. In the illustrated embodiment, the locating guide 162 is an aperture formed in desired locations on the panel of the housing 78 facing the mounting plate 150. The mounting plate 150 includes at least one pre-attachment registration mechanism 164. In the illustrated embodiment, the pre-attachment registration mechanism 164 is a shear-formed mounting hook formed along the surface of the mounting plate 150. The locating guide 162 and pre-attachment registration mechanism 164 permit registration of the gaming control board assembly 148 and the game interface board 60 so that both are in the proper alignment before they are urged together.

In other embodiments, the locating guide 162 may be a shear-formed mounting hook and the pre-attachment registration mechanism 164 may be an aperture, or the locating guide 162 or pre-attachment registration mechanism 164 may be a rail, groove, channel, or the like formed so as to align the gaming control board assembly 148 and the game interface board 60 in the pre-attachment position. A positioning guide 166 attached to the mounting plate 150 is bent slightly outwards from the plane of the mounting plate 150 to help guide the gaming control board assembly 148 into the pre-attachment position. A user positions the gaming control board assembly 148 against the positioning guide 166 and "slides" the gaming control board assembly 148 along the positioning guide 166 until the locating guides 162 and pre-attachment registration mechanism 164 are aligned with each other. Other positioning tabs may be formed to further assist the user in registering the gaming control board assembly 148 with the game interface board 60.

Figure 5:
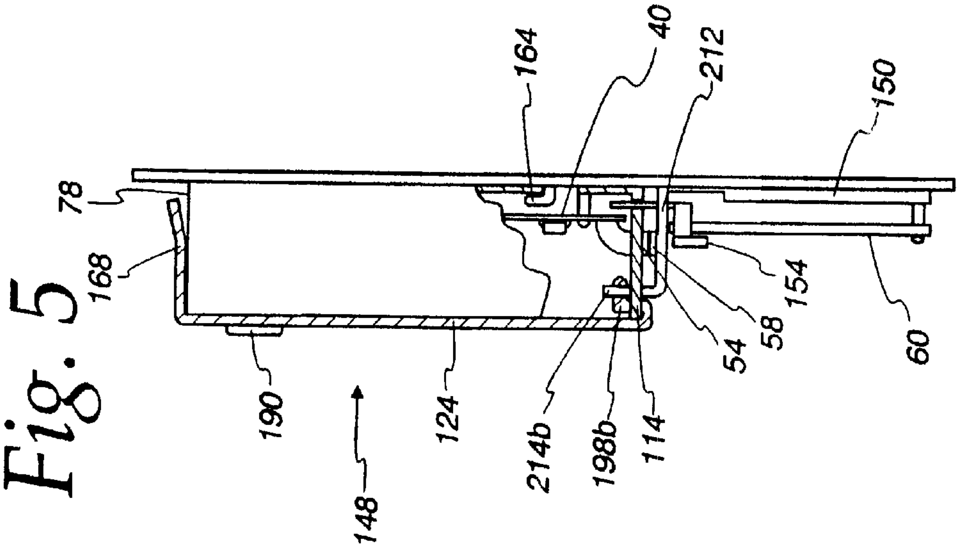
FIG. 5 is a section view taken along Line 5—5 in FIG. 4.

FIG. 5 illustrates a side view of the gaming control board assembly 148 in a docked position relative to the game interface board 60. In the docked position, the second connector 54 engages the second game interface board connector 58 as shown, and the first connector 52 also engages the first game interface board connector 56. The pre-attachment registration mechanism 164 holds the housing 78 against the mounting plate 150 and prevents the housing 78 from being pulled away from the mounting plate 150.

The door 124 of the housing 78 includes a security tab 168 (also shown in FIG. 8) to prevent unauthorized access to the CompactFlash card slot 138. When the door is secured to the housing 78, the security tab 168 covers the CompactFlash card slot 138, preventing CompactFlash cards from being inserted into or removed from the CompactFlash card housing 140. In embodiments that do not include a CompactFlash card slot, the door 124 does not include the security tab 168. In still other embodiments, other security tabs may be formed on the door 124 to prevent access to certain I/O ports via the rear interchangeable panel 130 of the housing 78.

Figure 8:
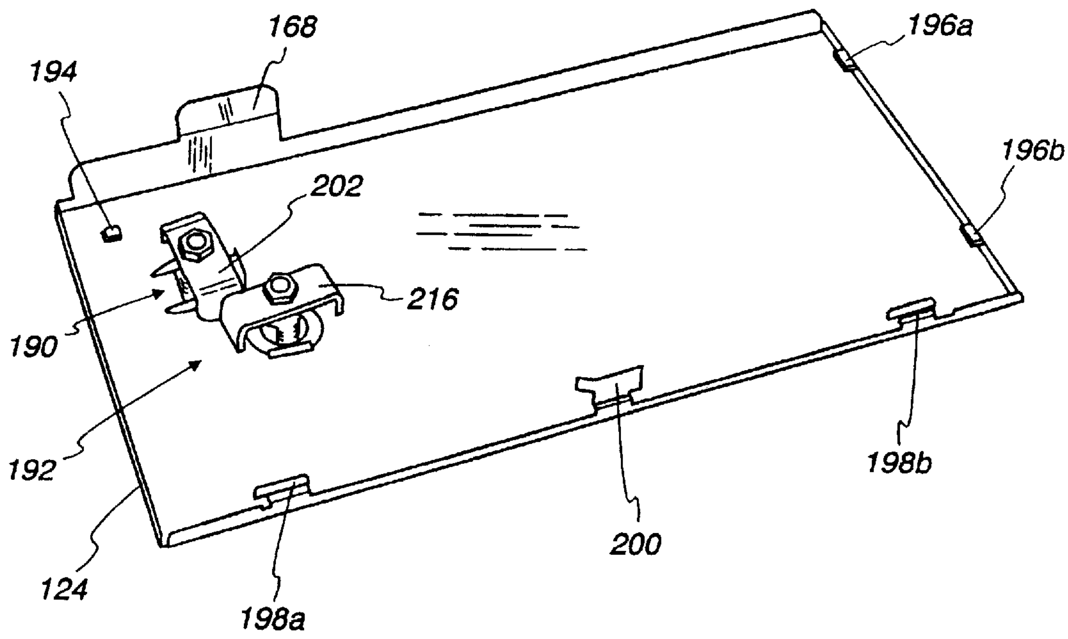
FIG. 8 is a bottom view of a door to the housing of the system shown in FIG. 4 according to a specific aspect of the present invention.

The operation of the operating lever 154 between an undocked position and a docked position will be discussed next with reference to FIGS. 7 and 8. For ease of illustration, some of the details shown in FIGS. 4–6 are not shown in FIGS. 7 and 8. For example, it is understood that the housing 78 encloses the gaming control board 40. In FIG. 6, the operating lever 154 is in the undocked position. The first latching member 156 includes a first engaging member 170 and a first disengaging member 172. Similarly, the second latching member 158 includes a second engaging member 174 and a second disengaging member 176. When the gaming control board assembly 148 is in the pre-attachment position, the first and second latching members 156, 158 protrude through the front panel 114 of the housing 78 via the first and second latch engaging slots 110, 112.

When the operating lever 154 is urged from the undocked position towards the docked position in the direction of arrow B, the first engaging member 170 and the second engaging member 174 engage the front panel 114 of the housing 78 and urge the housing 78 towards the game interface board 60. Additionally, the connecting member 160 is urged in the direction of arrow C and rotation of the first latching member 156 and the second latching member 158 about their respective pivot points 178, 180 is achieved. Preferably, the direction of arrow B is the same as the direction required to interconnect the gaming control board assembly 148 and the game interface board 60.

In FIG. 7, the operating lever 154 is in the docked position. The first and second engaging members 170, 174 engage the front panel 114 of the housing 78. The gaming control board assembly 148 and the game interface board 60 are held in place in part by the frictional forces associated with the mating of the complementary connectors located on the gaming control board 40 and the game interface board 60.

When the operating lever 154 is urged in the direction of arrow D, the first disengaging member 172 and the second disengaging member 176 engage the front panel 114 of the housing 78 and urge the housing 78 away from the game interface board 60. The connecting member 160 is urged in the direction of arrow E and rotation of the first latching member 156 and the second latching member 158 about their respective pivot points 178, 180 is achieved. The spring 182 provides feedback to the operator of the operating lever 154 once the frictional forces between the complementary connectors are overcome. In this respect, the operating lever 154 will "spring" upwards in the direction of arrow D as the connectors on the control board 40 and game interface board 60 are separated, thereby informing the operator that the gaming control board assembly 148 and the game interface board 60 are disengaged. The spring 182 also operates to inform the operator whether the operating lever 154 is in the docked position. For example, if the operator only partly urges the operating lever 154 towards the docked position and then releases the operating lever 154, the spring 182 will cause the operating lever 154 to be returned to the undocked position. The spring 182 may also provide tactile feedback to the operator that the operating lever 154 is in the properly docked position.

The door 124 can be locked such that the gaming control board assembly 148 cannot be removed until the door 124 is unlocked and the operating lever 154 is in the undocked position. FIG. 8 illustrates one embodiment of the door 124 which includes a door lock 190 and a jam lock 192. As explained above, the security tab 168 prevents access to certain I/O ports on the gaming control board 40. The door 124 also includes an inner retention hook 194, first and second outer retention hooks **196*a*, 196*b*, first and second door hinges 198*a*, 198*b*, and a switch actuator flange 200**.

To secure the door 124 to the housing 78, the first and second door hinges 198 are inserted into the first and second door hook apertures 116, respectively, and the door 124 is rotated to cover the housing 78. When the operating lever 154 is in the locked position (shown in FIG. 7), the door lock 190 is turned (by using a key or tool, for example) which causes the door lock cam 202 to engage a door lock engaging guide 204 shown in FIG. 4. The door lock engaging guide 204 is angled as shown in FIG. 4 so that as the door lock cam 202 is turned, the door 124 is urged in the direction of arrow A shown in FIG. 4. When the door lock 190 is turned to a locked position, several events occur to secure the door 124 to the housing 78.

First, the inner retention hook 194 engages a retention hook flange 206 shown in FIG. 4 and secures the door 124 to the housing 78. The location of the inner retention hook 194 prevents tampering with the hook 194 from the opposite side of the door 124.

Second, the outer retention hooks 196 engage outer retention hook apertures (not shown) formed on a side panel of the housing 78. These outer retention hooks 196 also secure the door 124 to the housing 78.

Third, the switch actuator flange 200 is urged in the direction of arrow A and actuates a toggle switch 208 which extends through the switch aperture 122 shown in FIG. 3. The toggle switch 208 (shown in FIG. 4) is used by the gaming control board 40 to detect whether the door 124 is locked or unlocked. If unauthorized entry is detected, an alarm condition may be generated by the gaming control board 40. The gaming control board 40 may also store a log of when the door 124 is locked or unlocked. A switch housing 210 prevents tampering of the toggle switch 208 from outside the housing 78. It is understood that any other suitable switch such as a push-button switch may be used in lieu of a toggle switch to detect whether the door 124 is locked or unlocked.

Fourth, the mounting plate 150 includes a docking plate 212 shown in FIG. 5 that includes a first docking hook **214*a* and a second docking hook 214*b* shown in FIG. 4. When the door 124 is urged toward the locked position in the direction of arrow A, the first and second door hinges 198 on the door 124 engage the first and second docking hooks 214, respectively. In this manner, the first and second docking hooks 214 operate to secure the door 124 to the housing 78 and to secure the docking plate 212 to the housing 78. Note that the housing 78 is also secured to the mounting plate 150 via the first and second latching members 156, 158** as explained above.

Fifth, as the door lock 190 is turned to the locked position, the door lock cam 202 also operates to secure the door 124 to the housing 78 as the portion of the door lock cam 202 facing the control board 40 swings under the door lock engaging guide 204.

When the door lock 190 is turned to the locked position, the door lock 190 is locked by turning the jam lock 192 to a locked position. The jam lock 192 includes a jam lock cam 216, which prevents the door lock cam 202 from being turned when both the door lock 190 and jam lock 192 are in the locked positions, and the jam lock cam 216 engages a jam lock engaging guide 218 which stops the rotation of the jam lock cam 216 once the jam lock 192 is in the locked position. Once the door 124 is locked via the door lock 190, the operating lever 154 cannot be engaged to separate the gaming control board assembly 148 from the game interface board 60.

Thus, when the door lock 190 and the jam lock 192 are in the locked position and the operating lever 154 is in the docked position, access to the gaming control board 40 is prevented. Note that while the foregoing discussion included a number of specific structures for securing the door 124 to the housing 78, it is expressly understood that fewer, additional, and/or other structures may be employed without departing from the scope of the present invention. For example, in other embodiments, only one door lock may be employed to lock the door in position; the inner retention hook 194 or outer retention hooks 196*a,b* may be eliminated; additional inner retention and outer retention hooks may be provided; the door 124 may slideably engage the housing 78 rather than hingedly engage the housing 78 as illustrated; the first and second docking hooks 214*a,b* may be eliminated; and so forth.

Figure 9:
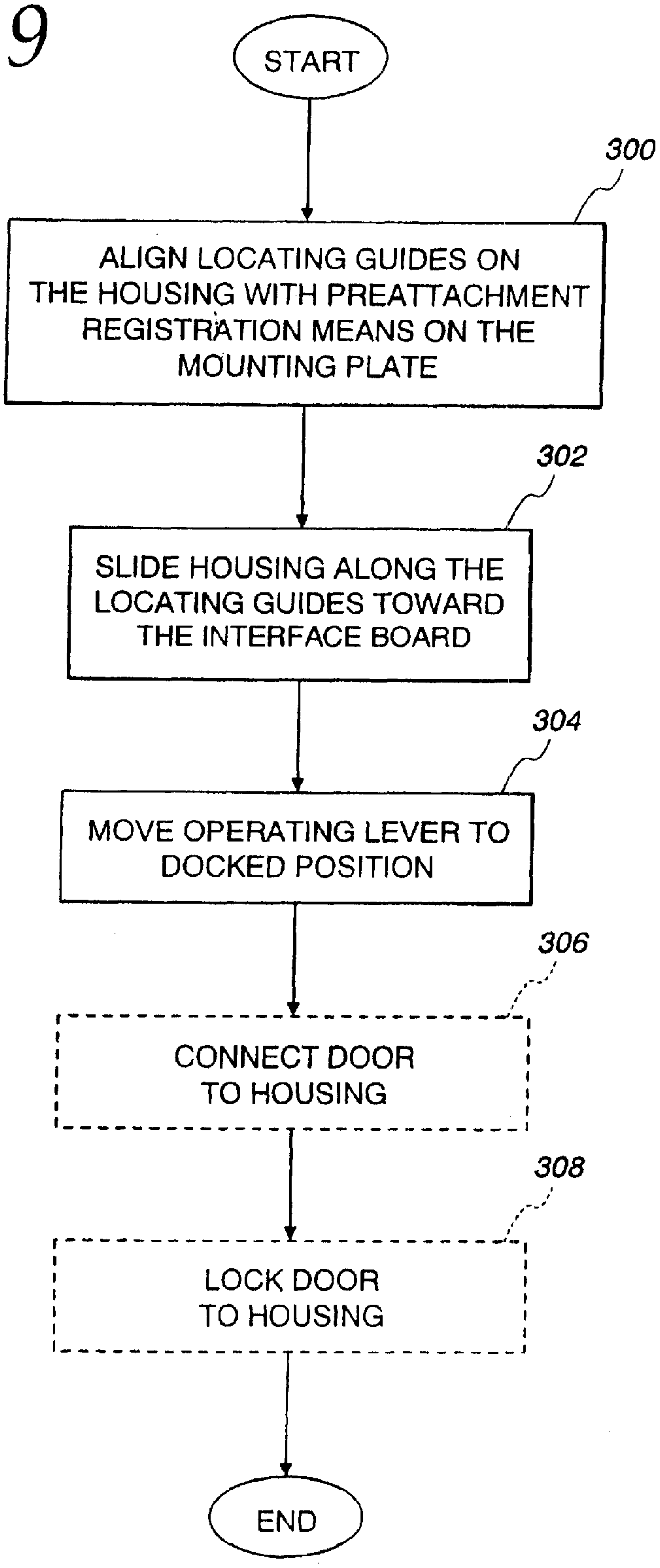
FIG. 9 is a flow chart illustrating the steps for releasably interconnecting a gaming control board and a game interface board.

FIG. 9 is a flow chart describing a docking operation to interconnect the gaming control board assembly 148 to the game interface board 60. An operator aligns the locating guides 162 on the housing 78 with the pre-attachment registration mechanism 164 on the mounting plate 150 (step 300). The positioning guide 166 assists the operator to initially position the housing 78 to increase the likelihood of aligning the locating guides 162 and pre-attachment registration mechanism 164 on the first attempt. At step 302, the housing 78 is slid along the locating guides toward the game interface board 60 to a pre-attachment position. In the illustrated embodiment shown in FIG. 5, the operator may simply release the housing 78 once it is registered, and gravity will slide the housing 78 to the pre-attachment position.

At step 304, the operator moves the operating lever 154 to a docked position. At step 306, the operator connects the door 124 to the housing 78 by inserting the first and second door hinges 198*a,b* into the first and second door hook apertures 116*a,b*, respectively. Step 306 may be performed before or after any of steps 300, 302, or 304. In an embodiment where the housing 78 does not include the door 124, step 306 is omitted.

In a preferred embodiment, the door 124 is locked to the housing 78 at step 308. In an embodiment where the door 124 does not lock, step 308 is omitted.

Figure 10:
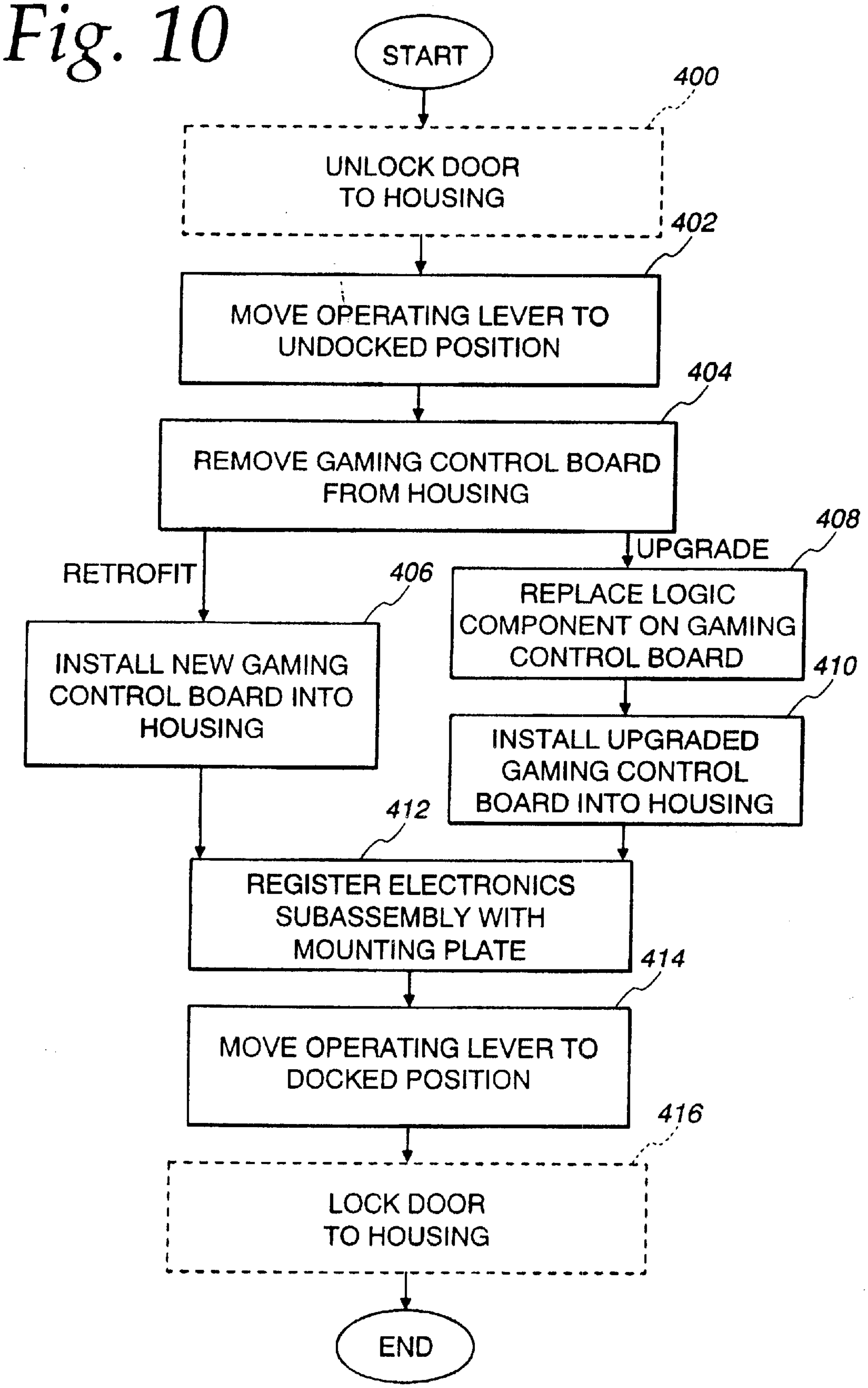
FIG. 10 is a flow chart illustrating the steps for retrofitting or upgrading a gaming control board according to one aspect of the present invention.

FIG. 10 illustrates how the gaming control board 40 can be replaced, repaired, or upgraded according to the present invention. Note that the gaming control board 40 can be optionally replaced, repaired, or upgraded outside of the gaming machine in one embodiment, or inside the gaming machine in another embodiment. At step 400, the door 124 is unlocked and the operating lever 154 is urged to the undocked position at step 402. Optionally, the gaming control board assembly 148 which includes the housing 78 and the gaming control board 40 is removed from the gaming machine. Whether inside the gaming machine or outside, the gaming control board 40 is removed from the housing 78 at step 404. Removal of the gaming control board 40 is facilitated by removal of the rear interchangeable panel 130 of the housing 78, the door 124, or a combination of the two. For example, in an embodiment that lacks the door 124, the gaming control board 40 may be slid out of the housing 78 via the rear interchangeable panel 130.

In the case of a retrofit, a new gaming control board is installed into the housing 78 at step 406. Again, it is understood that the new gaming control board can be installed into the housing within the gaming machine or outside the gaming machine. The gaming control board 40, for example, may be damaged or obsolete and require replacement. Alternatively, the gaming control board 40 may be replaced by a different gaming control board and a different rear interchangeable panel installed as explained above.

In the case of an upgrade, a logic component on the gaming control board 40 is replaced at step 408 to form an upgraded gaming control board. The replacement may be in the form of an upgrade to the logic component, such as reprogramming new instructions and/or data on the logic component, a different logic component, or a working logic component in the case where the logic component is damaged. At step 410, the upgraded gaming control board is installed into the housing 78. Again, the upgrade may occur either while the gaming control board 40 is inside or outside the gaming machine. In another embodiment, the door 124 of the housing 78 is removed or partially opened to expose the gaming control board 40, and the logic component on the gaming control board 40 is replaced without engaging the operating lever 154.

The gaming control board assembly 148 is registered with the mounting plate (step 412) and the operating lever 154 is moved to the docked position (step 414). At step 416, the door is optionally locked to the housing to create a secure environment for the retrofitted or upgraded gaming control board.

In a specific embodiment, the gaming control board 40 can be replaced without removing it from the housing 78 and without operating the lever 154. In this embodiment, the electrical connections between first connector 52 and first game interface board connector 56 and between the second connector 54 and second game interface board connector 58 are broken such that an open circuit is created between the gaming control board 40 and the game interface board 60. The electrical connections can be broken by, for example, cutting electrical traces leading from the first game interface board connector 56 and the second game interface board connector 58 on the game interface board 60, or by cutting exposed wire leads from the first game interface board connector 56 and the second game interface board connector 58 to create open circuits. Once all of the electrical connections between the gaming control board 40 and the game interface board 60 are broken, a replacement gaming control board (not shown) can be coupled to the game interface board 60 by re-establishing electrical connections between the first game interface board connector 56 and the second game interface board connector 58 and the appropriate electrical wires on the replacement gaming control board.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A docking assembly in a gaming machine, comprising:

an interface board secured within said gaming machine;

an electronics subassembly including a housing and a gaming control board mounted within said housing, said gaming control board including a memory storing instructions for randomly selecting at least one game outcome in response to a wager and a processing unit adapted to execute said instructions; and a docking mechanism for releasably interconnecting said electronics subassembly and said interface board.

2. The assembly of claim 1, wherein said docking mechanism includes an operating lever moveable between a docked position and an undocked position and a first latch coupled to said operating lever.

3. The assembly of claim 1, wherein said docking mechanism includes an operating lever moveable between a docked position and an undocked position, and said interface board includes an interface board connector adapted to engage a complementary connector on said gaming control board, said interface board connector mating with said complementary connector so as to provide an electrical connection between said gaming control board and said interface board in response to said operating lever moving to said docked position.

4. The assembly of claim 2, wherein said first latch includes an engaging member adapted to engage and hold said electronics subassembly to said interface board in response to urging said operating lever toward said docked position.

5. The assembly of claim 2, wherein said first latch includes a latch disengaging member adapted to release said electronics subassembly from said interface board in response to urging said operating lever toward said undocked position.

6. The assembly of claim 2, wherein said interface board includes an interface board connector adapted to engage a complementary connector mounted on said gaming control board, said interface board connector mating with said complementary connector so as to provide an electrical connection between said gaming control board and said interface board in response to said operating lever moving to said docked position.

7. The assembly of claim 1, further including a mounting plate coupled to said housing, wherein said housing includes at least one locating guide and said mounting plate includes at least one pre-attachment registration means for receiving said locating guide so as to register said electronics subassembly and said interface board.

8. The assembly of claim 7, wherein said electronics subassembly and said interface board are registered prior to operation of said docking mechanism.

9. The assembly of claim 7, wherein said at least one locating guide is an aperture and said at least one pre-attachment registration means is a shear-formed mounting hook, said aperture being dimensioned to receive said shear-formed mounting hook.

10. The assembly of claim 7, wherein said at least one locating guide is a shear-formed mounting hook and said at least one pre-attachment registration means is an aperture dimensioned to receive said shear-formed mounting hook.

11. The assembly of claim 1, wherein said gaming control board includes logic circuitry and high-power circuitry, said high-power circuitry interfacing said gaming control board with high-power devices of said gaming machine, and wherein said housing is metal, said housing shielding said logic circuitry and said high-power circuitry from the effects of electromagnetic interference.

12. The assembly of claim 11, wherein said high-power devices include at least one of the group consisting of lamps visible to a player of said gaming machine, a hopper, a currency detector, a power supply, a display, and a reel.

13. The assembly of claim 1, wherein said gaming control board and said interface board are in a generally coplanar arrangement.

14. A docking system for use in a gaming machine, comprising:

an interface board mounted within said gaming machine, said interface board including a first interface board connector and a second interface board connector;

a gaming control board including logic circuitry and high-power circuitry, a first connector coupled to said logic circuitry, said logic circuitry including a memory storing instructions for randomly selecting at least one game outcome in response to a wager and a processing unit adapted to execute said instructions, said first connector providing low-power signals from said logic circuitry to said first interface board connector, and a second connector coupled to said high-power circuitry, said second connector providing high-power signals from said high-power circuitry to said second interface board connector, said gaming control board being in a generally coplanar relationship with said interface board; and a docking mechanism adapted to releasably interconnect said first connector and said second connector with said first interface board connector and said second interface board connector, respectively.

15. The system of claim 14, wherein said memory includes one of a read-only memory, a battery-backed random-access memory, and a nonvolatile random-access memory.

16. The system of claim 14, wherein said docking mechanism includes a lever moveable between a docked position and an undocked position, said lever including a latch rotatably mounted on said lever, said latch interconnecting and holding said gaming control board and said interface board in a fixed relationship when said lever is moved to said docked position, said latch releasing said gaming control board from said interface board when said lever is moved to said undocked position.

17. A system of releasably interconnecting a gaming control board to a fixed interface board in a gaming machine, comprising an operating lever moveable between a first position and a second position, said gaming machine having peripheral devices coupled to said fixed interface board of said gaming machine, said gaming control board including a memory storing instructions for randomly selecting at least one game outcome in response to a wager and a processing unit adapted to execute said instructions, said peripheral devices in said gaming machine being electrically coupled to components on said gaming control board in response to the movement of said lever from said first position to said second position.

18. The system of claim 17, wherein said peripheral devices include lamps visible to a player of said gaming machine.

19. The system of claim 17, wherein said peripheral devices include one of a hopper and a currency validator.

20. A method of releasably interconnecting a gaming control board and an interface board in a gaming machine, comprising the steps of:

providing a gaming control board including a memory storing instructions for randomly selecting at least one game outcome in response to a wager and a processing unit adapted to execute said instructions;

generally aligning said gaming control board with said interface board in said gaming machine; and moving an operating lever to a docked position to cause an electrical connector on said gaming control board to matingly engage a complementary electrical connector on said interface board.

21. A method of releasably docking a first circuit board to a second circuit board in a gaming machine, comprising the steps of:

providing a first circuit board including a memory storing instructions for randomly selecting at least one game outcome in response to a wager and a processing unit adapted to execute said instructions;

aligning a locating guide formed on a housing enclosing said first circuit board with a preattachment registration mechanism in said gaming machine;

sliding said housing along said locating guide in said first direction until connectors of said first circuit board are positioned proximate to complementary connectors of said second circuit board; and urging an operating lever from a first position to a second position to mate said connectors with said complementary connectors.

22. The method of claim 21, further comprising locking a door to said housing to prevent access to said first circuit board.

23. The method of claim 21, wherein said urging is in a direction that is generally in one direction.

24. The method of claim 21, wherein the step of sliding is primarily carried out by gravity.

25. The method of claim 21 further comprising releasing said connectors from said complementary connectors by urging said operating lever from said second position to said first position.

26. The method of claim 21, wherein said connectors include a first connector and a second connector, said first connector adapted to receive low-power signals from logic circuitry disposed on said first circuit board, said second connector adapted to receive high-power signals from high-power circuitry disposed on said first circuit board, said second connector being coupled to high-power devices of said gaming machine.

27. A method of retrofitting a gaming control board of a gaming machine, comprising:

moving a lever to an undocked position, said lever including a latch pivotally connected thereto, said moving causing said latch to disengage connectors of a gaming control board from complementary connectors of an interface board secured to said gaming machine, said gaming control board including a memory storing instructions for randomly selecting at least one game outcome in response to a wager and high-power circuitry for controlling high-power devices of said gaming machine, said gaming control board being enclosed in a housing;

removing said gaming control board from said housing;

installing a new gaming control board into said housing to form a new housing assembly, said new gaming control board including a memory storing instructions for randomly selecting at least one game outcome in response to a wager and a processing unit adapted to execute said instructions and high-power components for controlling high-power devices of said gaming machine;

positioning said new housing assembly to engage said interface board; and moving said lever toward a docked position to cause said latch to engage said new gaming control board to said interface board.

28. The method of claim 27, wherein said housing includes a material adapted to shield against the effects of electromagnetic interference.

29. The method of claim 28, wherein said EM-shielded housing includes a removable access panel to facilitate installation of said new gaming control board and removal of said gaming control board.

30. A method of upgrading a gaming control board of a gaming machine, comprising:

moving a lever in a docking mechanism toward an undocked position to disengage a gaming control board from an interface board secured to said gaming machine, said gaming control board including logic components, said logic components including a memory storing instructions for randomly selecting at least one game outcome in response to a wager and a processing unit being adapted to execute said instructions;

removing said gaming control board from said gaming machine;

replacing at least one of said logic components of said gaming control board so as to create an upgraded gaming control board;

positioning said upgraded gaming control board to engage said interface board; and moving said lever toward a docked position to engage said upgraded gaming control board to said interface board.

31. The method of claim 30, wherein said replacing includes swapping at least one of said logic components for another logic component.

32. The method of claim 30, wherein said replacing includes:

removing a damaged one of said logic components from said gaming control board; and installing a working logic component in place of the damaged logic component.

33. The method of claim 30, wherein said logic components include a nonvolatile memory, said nonvolatile memory including instructions and data associated with the operation of said gaming machine, and wherein said replacing includes downloading new instructions into said nonvolatile memory so as to replace old instructions in said nonvolatile memory.

34. The method of claim 30, wherein said replacing includes adding at least one additional logic component to said gaming control board.

35. A method of electrically coupling a peripheral device of a gaming machine to a gaming control board via a fixed interface board, comprising:

coupling said peripheral device to said fixed interface board;

coupling a power supply to said fixed interface board; and moving a lever from a first position to a second position to electrically couple said peripheral device to said gaming control board and to provide power from said power supply to electrical components of said gaming control board, said electrical components including a memory storing instructions for randomly selecting at least one game outcome in response to a wager and a processing unit executing said instructions when said power is provided to said processing unit.

36. A method of assembling a docking assembly for use in a gaming machine, comprising:

mounting an interface board within said gaming machine, said interface board including a first interface board connector and a second interface board connector disposed thereon;

mounting a gaming control circuit inside a housing, said gaming control circuit including a memory storing instructions for randomly selecting at least one game outcome in response to a wager and a processing unit adapted to execute said instructions; and attaching a first latch and a second latch to a lever, said first latch and said second latch being adapted to mate said first connector with said first interface board connector and to mate said second connector with said second interface board connector when said lever is moved from a first position to a docked position.

37. A method of undocking a gaming control board from an interface board in a gaming machine, comprising urging a lever to cause a connector of said gaming control board to disengage from a connector of said interface board, said gaming control board including a memory storing instructions for randomly selecting at least one game outcome in response to a wager and a processing unit adapted to execute said instructions.

38. A method of disengaging a gaming control board from an interface board in a gaming machine, comprising turning a lock to permit disengagement of said gaming control board from said interface board, said gaming control board including a memory storing instructions for randomly selecting at least one game outcome in response to a wager and a processing unit adapted to execute said instructions.

39. The method of claim 38, wherein said turning is carried out using a key.

40. The method of claim 38, wherein said turning is carried out using a tool.

41. A method of removing a gaming control board from a housing in a gaming machine, comprising:

disengaging a connector of said gaming control board from a connector of an interface board in said gaming machine, said gaming control board including a memory storing instructions for randomly selecting at least one game outcome in response to a wager and a processing unit adapted to execute said instructions; and removing said gaming control board from said housing.

42. The method of claim 41 further comprising removing a panel of said housing to permit access to said gaming control board.

43. The method of claim 42, wherein said panel is a door.

44. The method of claim 42, wherein said panel is a rear panel.

45. A method of replacing an existing gaming control board in a gaming machine with a replacement gaming control board, comprising:

breaking electrical connections between said existing gaming control board and an interface board to which said existing gaming control board is connected, said existing gaming control board including a memory storing instructions for randomly selecting at least one game outcome in response to a wager and a processing unit adapted to execute said instructions; and re-routing electrical connections from said interface board to said replacement gaming control board.

46. The method of claim 45 wherein said breaking includes creating open circuits between said electrical connections between said existing gaming control board and said interface board.

47. The method of claim 45 wherein said breaking includes cutting exposed wire leads from connectors on said interface board to create open circuits between said electrical connections between said existing gaming control board and said interface board.

48. A docking assembly in a gaming machine, comprising:

an interface board secured within said gaming machine;

an electronics subassembly including a housing and a gaming control board mounted within said housing, said gaming control board including a processing unit adapted to execute instructions for randomly selecting at least one game outcome; and a docking mechanism for releasably interconnecting said electronics subassembly and said interface board, said docking mechanism including an operating lever moveable between a docked position and an undocked position and a first latch coupled to said operating lever, said docking mechanism further including a second latch coupled to said operating lever.

49. A docking assembly in a gaming machine, comprising:

an interface board secured within said gaming machine;

an electronics subassembly including a housing and a gaming control board mounted within said housing, said gaming control board including a processing unit adapted to execute instructions for randomly selecting at least one game outcome; and a docking mechanism for releasably interconnecting said electronics subassembly and said interface board, said docking mechanism including an operating lever moveable between a docked position and an undocked position and a first latch coupled to said operating lever, said first latch including an engaging member adapted to engage and hold said electronics subassembly to said interface board in response to urging said operating lever toward said docked position, said housing including a slot adapted to receive said engaging member of said first latch.

50. A docking assembly in a gaming machine, comprising:

an interface board secured within said gaming machine;

an electronics subassembly including a housing and a gaming control board mounted within said housing, said housing including a door hingedly connected to said housing, said door including a lock for securing said door to said housing, said gaming control board including a processing unit adapted to execute instructions for randomly selecting at least one game outcome; and a docking mechanism for releasably interconnecting said electronics subassembly and said interface board.

* * * * *